US006914831B2

United States Patent
Di Iorio

(12) United States Patent
(10) Patent No.: US 6,914,831 B2
(45) Date of Patent: *Jul. 5, 2005

(54) LOW VOLTAGE CURRENT REFERENCE

(75) Inventor: Ercole Di Iorio, Scurcola Marsicana (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/822,771

(22) Filed: Apr. 13, 2004

(65) Prior Publication Data

US 2004/0190332 A1 Sep. 30, 2004

Related U.S. Application Data

(63) Continuation of application No. 10/146,112, filed on May 16, 2002, now Pat. No. 6,738,297.

(30) Foreign Application Priority Data

Mar. 21, 2002 (IT) .................................... TO2002A0252

(51) Int. Cl.[7] ................................................ G11C 7/00
(52) U.S. Cl. .................................. 365/189.09; 365/211
(58) Field of Search ............................. 365/189.09, 211

(56) References Cited

U.S. PATENT DOCUMENTS

| | | |
|---|---|---|
| 4,994,688 A | 2/1991 | Horiguchi et al. |
| 5,517,103 A | 5/1996 | Ng et al. |
| 5,646,516 A | 7/1997 | Tobita |
| 5,686,825 A | 11/1997 | Suh et al. |
| 5,694,033 A | 12/1997 | Wei et al. |
| 5,745,000 A | 4/1998 | Boerstler et al. |
| 5,821,807 A | 10/1998 | Brooks |
| 5,864,504 A | 1/1999 | Tanzawa et al. |
| 5,883,507 A | 3/1999 | Yin |
| 5,933,051 A | 8/1999 | Tsuchida et al. |
| 6,052,020 A | 4/2000 | Doyle |
| 6,060,945 A | 5/2000 | Tsay |
| 6,147,548 A | 11/2000 | Doyle |

*Primary Examiner*—Hoai Ho
(74) *Attorney, Agent, or Firm*—Dickstein Shapiro Morin & Oshinsky LLP

(57) ABSTRACT

A current reference for providing a stable current output across a range of temperatures and input power supply voltages by summing signals from a first and second current generation subcircuits which generate temperature dependent signals having in inverse relationship. The first current generation subcircuit includes two NMOS transistors and a resistor and has a negative thermal coefficient. The second current generation subcircuit includes two bipolar transistors and a resistor and has a positive thermal coefficient.

25 Claims, 5 Drawing Sheets

LOW VOLTAGE CURRENT REFERENCE

This application is a continuation of application Ser. No. 10/146,112, filed May 16, 2002 now U.S. Pat. No. 6,738,297, the subject matter of which is incorporated by reference herein.

FIELD OF THE INVENTION

The present invention relates in general to reference current generation circuits for semiconductor devices, and more particularly to a reference current generation circuit for outputting a nearly constant current across a range of temperatures and input voltages.

BACKGROUND OF THE INVENTION

Technological improvements in semiconductor processing have led to a substantial increase in the number of transistors fabricated on a single integrated circuit. Along with an increase in the number of transistors also comes an increase in the amount of power dissipated by the integrated circuit. In an effort to reduce power dissipation and consumption, engineers have reduced the voltage level of the power supplies in such integrated circuits, from the traditional 5 volts to about 3.3 volts. This trend is expected to continue. Some current integrated circuits, for example microprocessors, operate at least a portion of their circuitry voltages below 3.3 volts. It is expected that more and more integrated circuits will be operated at power supply voltages below 3.3 volts.

Many integrated circuits are increasingly using mixed signal circuits (e.g. digital and analog) to perform various functions, such as voltage or current controlled oscillators. In addition, other circuits such as D/A (digital-to-analog) converters and multipliers may be employed in integrated circuits. Non-volatile memories, such as flash memories, include a digital portion for reading and accessing data and an analog portion for erasing. These designs generally require a reference current which is relatively stable across a range of operating temperatures and power supply voltages. With the increasing use of low-level power supply voltages, it is even more difficult to provide a needed stable current reference.

Accordingly, there is a need for a current reference which provides stable current over a range of operating temperatures and power supply voltages for use in integrated circuits.

SUMMARY OF THE INVENTION

The present invention provides for a current reference which provides a stable output current over a range of operating temperatures and power supply voltages for use in an integrated circuit. The current reference is comprised of a first current generation subcircuit having a negative thermal coefficient, a second current generation subcircuit having a positive thermal coefficient, a summing circuit controlled by the first and second current generation subcircuits, and an output circuit.

DETAILED DESCRIPTION

Figure 1:
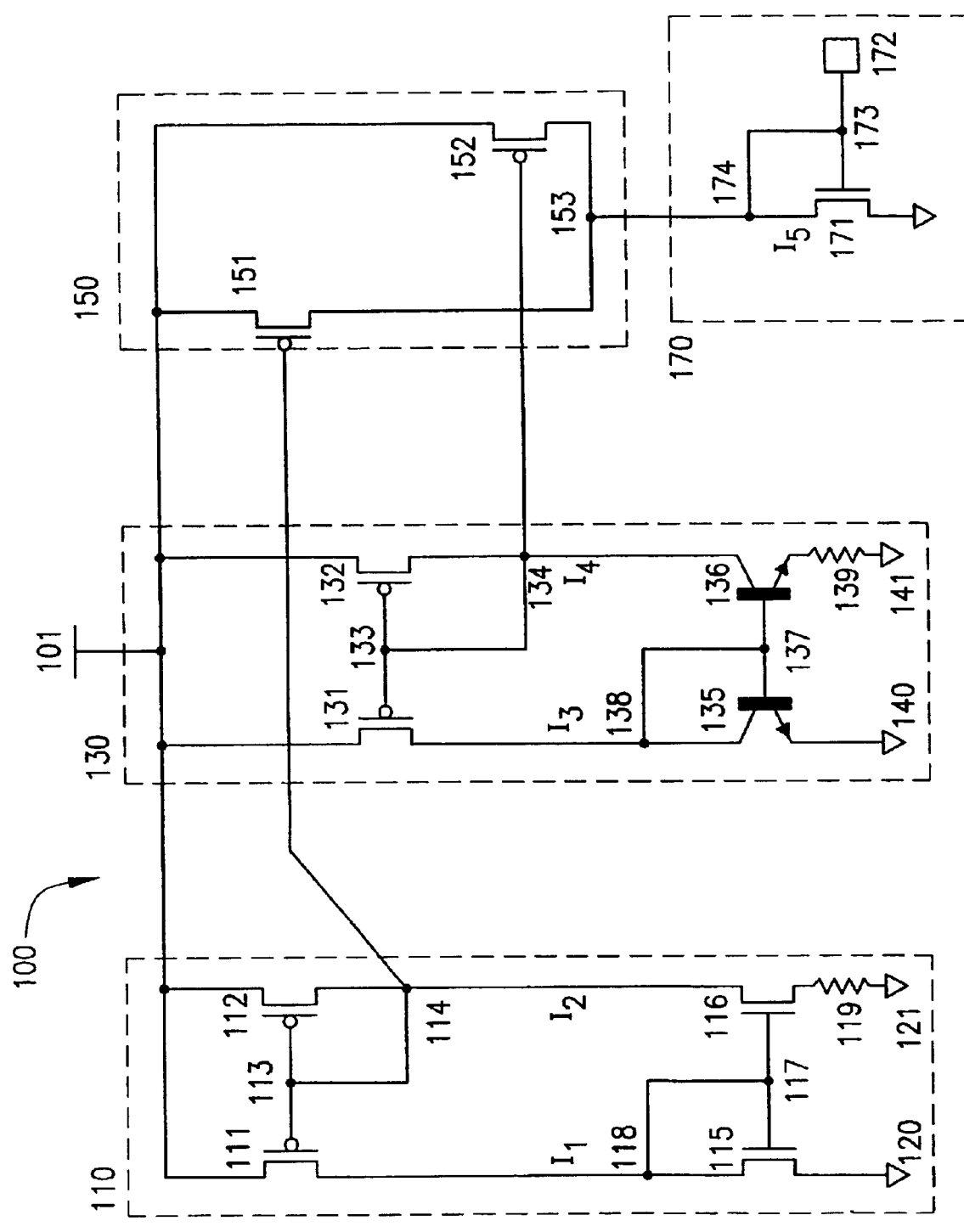
FIG. 1 is a schematic diagram of a current reference in accordance with the principles of the present invention.

Now referring to the drawings, where like reference numerals designate like elements, FIG. 1 is a schematic diagram of a current reference 100 in accordance with the principles of the present invention. The current reference includes a first current generation subcircuit 110, a second current generation subcircuit 130, a summing circuit 150 controlled by the first and second current generation subcircuits 110,130, and an output circuit 170. Input power (e.g., Vcc) is supplied from an input power terminal 101. The temperature compensation for current reference 100 is obtained by summing the current control signals from the first and second subcircuits 110, 130. The first current generation subcircuit 110 provides a control signal which allows the summing circuit 150 to generate a current component (e.g., current I5 in MOSFET 151) with a negative thermal coefficient, while the second current generation subcircuit 130 provides a control signal which allows the summing circuit 150 to generate a current component (for example, I6 in MOSFET 152) with a positive thermal coefficient.

The first current generation subcircuit 110 is a ΔVt circuit (where ΔVt represents the difference in threshold voltage of two FET transistors) and comprises two PMOS transistors 111–112 arranged in a current mirror configuration to deliver indentical currents I1, I2 to two NMOS transistors 115–116 having different threshold voltages. The two PMOS transistors 111–112 have their gates coupled together at node 113, and the drain of PMOS transistor 112 is coupled to the gates of PMOS transistors 111–112 via a coupling between node 113 and node 114. The current mirror formed by this arrangement ensures that current I1, the current flowing from the drain of PMOS transistor 111 to NMOS transistor 115, is identical to current I2, the current flowing from the drain of PMOS transistor 112 and NMOS transistor 116.

The gates of the NMOS transistors 115–116 are coupled together at node 117. Node 117 is also coupled to the drain of PMOS transistor 111 and the drain of NMOS transistor 115 at node 118. The source of NMOS transistor 115 is coupled to ground potential at node 120, while the source of NMOS transistor 116 is coupled to ground at node 121 through register 119.

As described above, the two NMOS transistors are to have different threshold voltages. In one embodiment, NMOS transistor 116 has a higher threshold voltage than NMOS transistor 115. The difference in threshold voltage between NMOS transistors 115–116 can be obtained using any suitable fabrication technique. For example, in one embodiment, thickness of the oxide layer of the NMOS transistor 115 is approximately twice the thickness in the oxide layer of NMOS transistor 116.

Input power is supplied to the first current generation subcircuit 110 via the input power terminal 101. In the first current generation subcircuit 110, with current I1 equal to current I2, the current I2 is governed by the following equation:

$$I2 = [Vt(115, T) - Vt(116,T)]/R(119,T) \qquad (1)$$

where:

Vt(115, T) is the threshold voltage of transistor 115, which is temperature dependent;

Vt(116, T) is the threshold voltage of transistor 116, which is temperature dependent; and R(119,T) is the resistance of resistor 119, which is temperature dependent.

Figure 2:
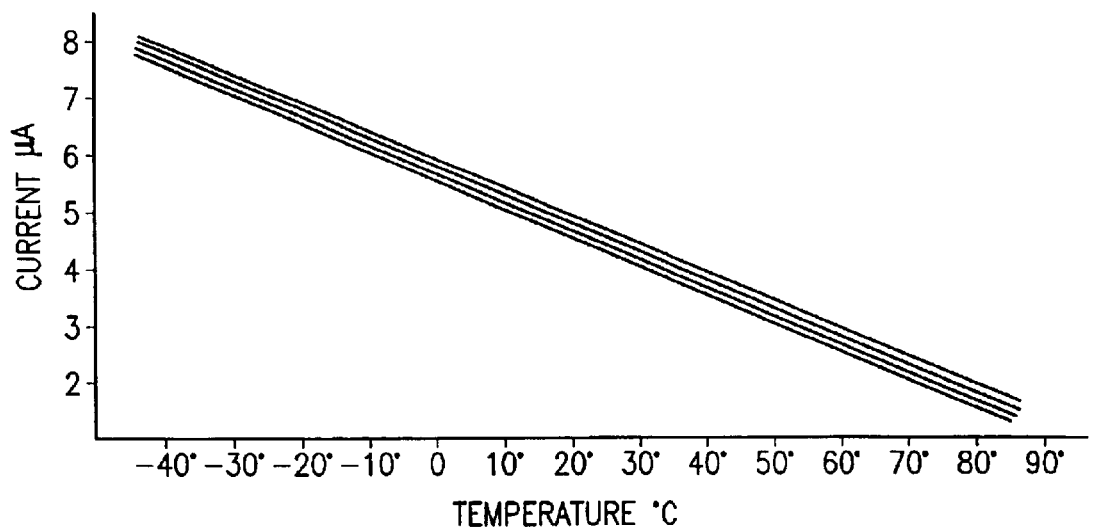
FIG. 2 is a graph illustrating how the current I2 inside the first current generation subcircuit varies across a range of temperatures and input voltages.

While the threshold voltages of the transistors, Vt(115, T) and Vt(116, T), vary with a negative thermal coefficient, the resistance of resistor 119 also varies according to temperature. Resistor 119 (and also resister 139 of the second current generation subcircuit 130) may be a conventional type of resistor with a positive thermal coefficient. That is, the resistance of the resistor increases as temperature increases and the resistance decreases as temperature decreases. The first current generation subcircuit 110 is designed so that the current I2 has a negative thermal coefficient, i.e., the current I2 tends to decrease as the temperature increases. As illustrated in FIG. 2, in one embodiment, the current I2 decreases linearly from approximately 8 micro ampere to 1.8 micro ampere as the temperature increases from −40 degrees to +90 degrees Celsius, respectively.

Thus, as temperatures increase, the current I2 decreases, causing the voltage at node 114 to increase. Likewise, as temperatures decrease, the current I2 increases, causing the voltage at node 114 to decrease. Since node 114 is coupled to the gate of PMOS transistor 151, the voltage applied to a portion of the summing circuit 150 is controlled in an inverse proportional manner by the temperature of the first current generation subcircuit 110.

The second current generation subcircuit 130 provides a control signal to the summing circuit 150 to generate a current component (e.g., current I6 in MOSFET 152) with a positive thermal coefficient (i.e., the inverse of the control signal generated by the first current generation circuit). The second current generation subcircuit 130 provides a control signal which allows the summing circuit 150 to generate a current component (e.g., current I6 in MOSFET 152) with a positive thermal coefficient (i.e., the inverse of the control signal generated by the first current generation subcircuit 110). The second generation subcircuit 130 comprises two PMOS transistors 131–132 arranged in a current mirror configuration to deliver identical currents I3 and I4 to two bipolar transistors 135–136. The two PMOS transistors 131–132 have their gates coupled together at node 133, and the drain of PMOS transistor 132 is coupled to the gates of PMOS transistors 131–132 via a coupling between nodes 133 and node 134. The current mirror formed by this arrangement ensures that current I3, the current flowing from the drain of PMOS transistor 131 to bipolar transistor 135, is identical to current I4, the current flowing from the drain of PMOS transistor 132 and bipolar transistor 136.

The gates of bipolar transistors 135–136 are coupled together at node 137. Node 137 is also coupled to the drain of PMOS transistor 131 and the base of bipolar transistor 135 at node 118. The emitter of the bipolar transistor 135 is coupled to ground potential at node 140, while the emitter of the bipolar transistor 116 is coupled to ground at node 141 through resister 139.

Input power is supplied at the source of PMOS transistors 131–132 via the input power terminal 101. In the second current generation subcircuit 130, the current I4 is governed by the following equation:

$$I4=[Vbe(135)-Vbe(136)]/R(139,T) \quad (2)$$

where:

Vbe(135) is the base-to-emitter voltage of bipolar transistor 135;

Vbe(136) is the base-to-emitter voltage of bipolar transistor 136; and

R(139,T) is the resistance of resistor 139.

If the current flowing through the bipolar transistors 135–136 are identical, it can be demonstrated that:

$$I4=[(K*T/q)*ln(A2/A1)]/R(139,T) \quad (3)$$

where:

K is Boltzman's constant;

q is the charge of an electron;

T is temperature (in degrees Kelvin);

A1 is the emitter area of transistor 135; and

A2 is the emitter area of transistor 136.

Figure 3:
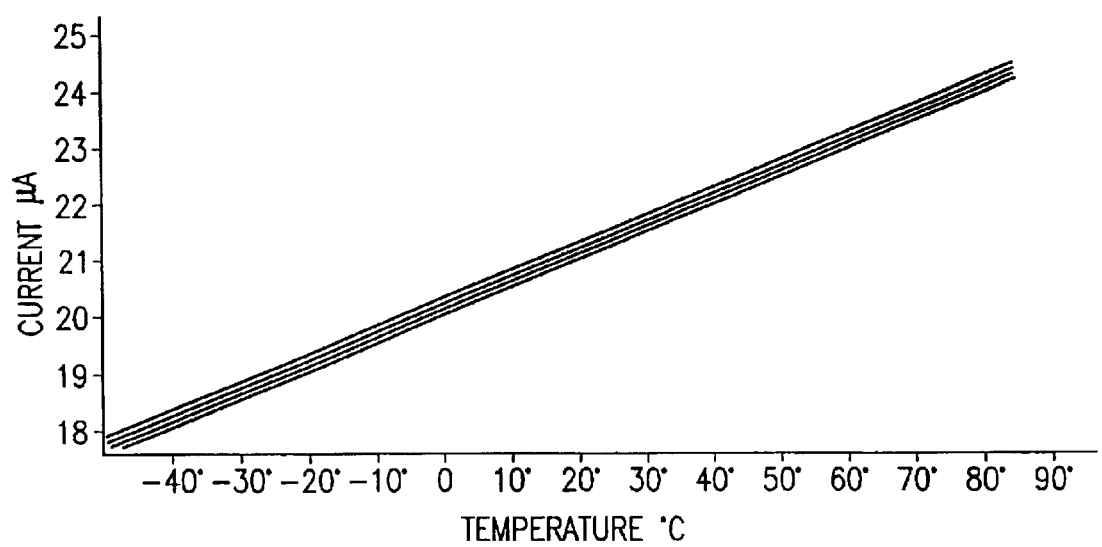
FIG. 3 is a graph illustrating how the current I4 inside the second current generation subcircuit varies across a range of temperature and input voltages.
Figure 4:
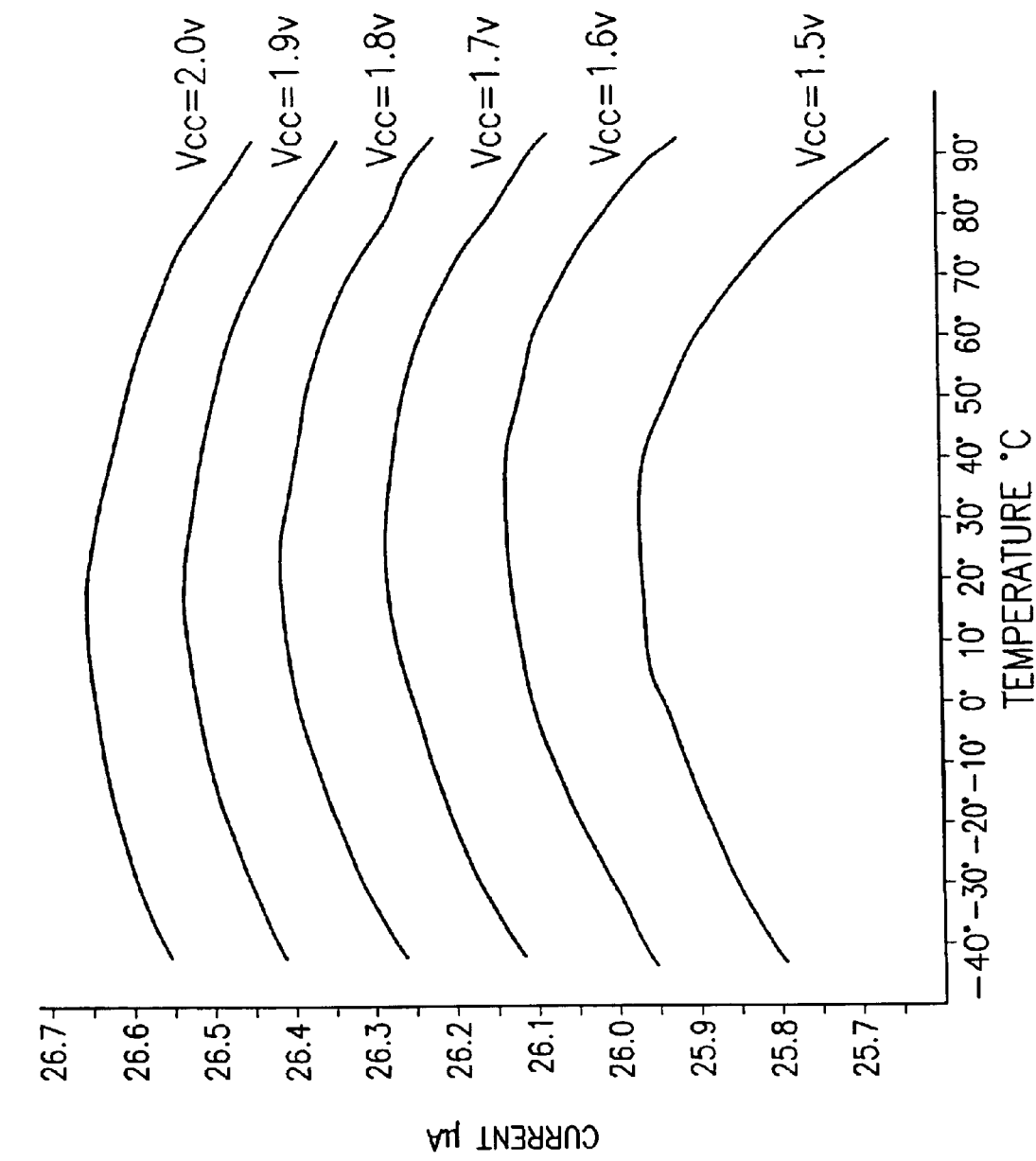
FIG. 4 is a graph illustrating how the current I5 inside the output circuit varies across a range of temperature and input voltages.

As can be seen from equation (3), the current I4 has a positive thermal coefficient, i.e., the current I4 increases as the temperature increases. In one embodiment, illustrated in FIG. 3, current I4 increases linearly from approximately 18.2 micro amps to 24.8 micro amps as the temperature increases from −40 degrees to +90 degrees Celsius, respectively. Thus, as temperature increases, the current I4 increases, causing the voltage at node 134 to decrease. Likewise, as temperature decreases, the current I4 decreases, causing the voltage at node 134 to increase. Since node 114 is coupled to the gate of PMOS transistor 151, the voltage applied to a portion of the summing circuit 150 is controlled in an inverse proportional manner by the temperature of the second current generation subcircuit 130.

The summing circuit 150 is comprised of a pair of PMOS transistors 151–152 which respectively control the amount of current delivered from the input power terminal to the node 153. More specifically, the current in the transistor 151 is controlled by the first current generation subcircuit 110 while the current of PMOS transistor 152 is controlled by the second current generation subcircuit 130. As noted above, the first and second current generation subcircuits 110, 130 are designed to react to temperature changes in opposite fashions. Thus any change in temperature will cause the current of one of the PMOS transistors 151, 152 to increase while the current in the other one of the PMOS transistors 151,152 decreases, thereby providing a temperature independent source of current available at node 153.

The output circuit is coupled to the output node 153 of the summing circuit and comprises an output terminal 172 where a reference voltage bias is provided (to bias gate terminal of external NMOS transistors). The output terminal is coupled to the gate of a NMOS transistor 171 via node 173, which is also coupled to the drain of the NMOS transistor 171 and the output node 153 of the summing circuit.

Thus, the current reference of the present invention is comprised of two current generation subcircuits 110, 130 which produce control voltages for adjusting the gains two transistors 151–152 in a summing circuit 150. Each current generation subcircuit comprises two PMOS transistors which form a current mirror. The current flowing through the current mirrors of each subcircuit flows through a difference circuit formed of two additional transistors and one resistor, which is dependent upon temperature. However, in one subcircuit, the current flow has a negative thermal coefficient, while in the other subcircuit the current flow has a positive thermal coefficient. The design of the generation subcircuits and the summing circuit provides the output circuit with a power supply which is stable across a range of temperatures and input voltages.

Figure 5:
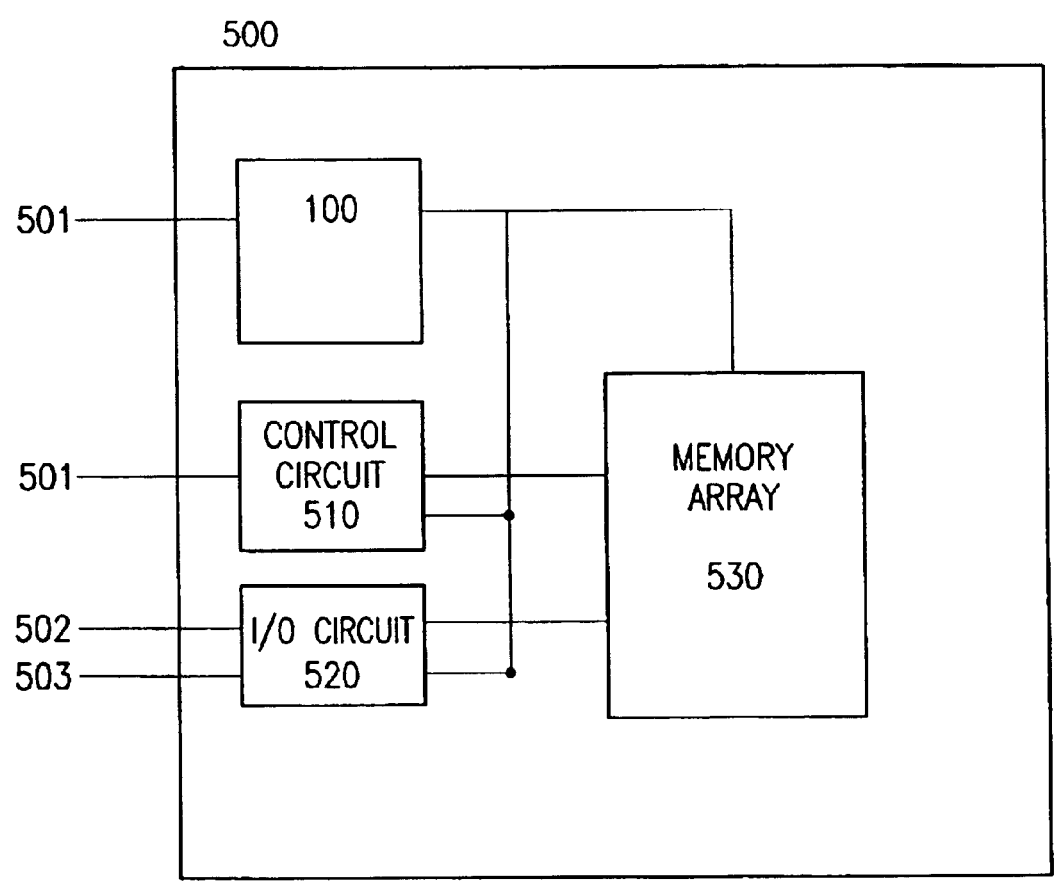
FIG. 5 is an illustration memory device incorporating the current reference illustrated in FIG. 1.

FIG. 5 is a block diagram of a memory device 500 including the current reference 100 of FIG. 1. The memory device includes a power line 501 for supply power to the memory device 500, a control bus 501, an address bus 502, and a data bus 503. The power line 501 is coupled to the current reference 100, which outputs temperature compensated power to various components of the memory device. These component may include a control circuit 510, an I/O circuit 520, and a memory array 530.

Figure 6:
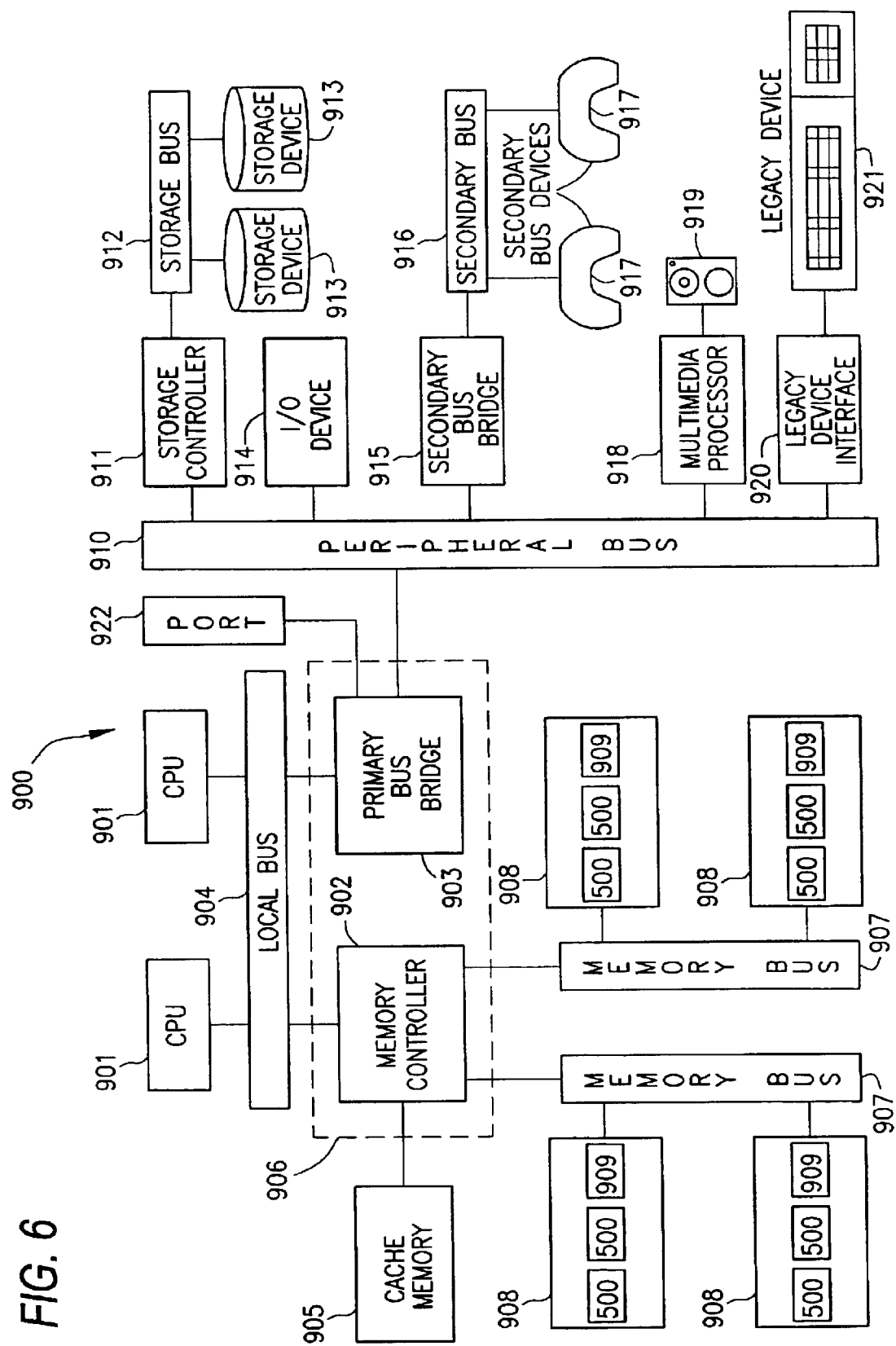
FIG. 6 is an illustration of a processor based system incorporating a memory device of FIG. 5.

FIG. 6 illustrates an exemplary processing system 900 which may utilize a memory device 500 having a current reference 100 of the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 500 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 6 is only an exemplary processing system with which the invention may be used. While FIG. 6 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The above description and accompanying drawings are only illustrative of exemplary embodiments, which can achieve the features and advantages of the present invention. It is not intended that the invention be limited to the embodiments shown and described in detail herein. The invention can be modified to incorporate any number of variations, alterations, substitutions or equivalent arrangements not heretofore described, but which are commensurate with the spirit and scope of the invention. The invention is only limited by the scope of the following claims.

What is claimed as new and desired to be protected by Letters Patent of the United States is:

1. A memory device, comprising:

a memory array;

a control circuit, coupled to said memory array;

a input/output circuit, coupled to said memory array; and a power circuit for supplying an output current to at least one of said memory array, said control circuit, and said input/output circuit, said power circuit comprising:

a first circuit comprising a first input node, a first output node, and a first current mirror;

a second circuit comprising a second input node, a second output node, and a second current mirror;

a third circuit, coupled to said first output node and said second output node, for producing said output current from an input current, said output current being approximately invariant over a range of temperature;

wherein said first current mirror flows a first current as a first function of temperature and said second current mirror flows a second current as a second function of temperature, and said first and second functions are approximately inverse functions of temperature.

2. The memory device of claim 1, wherein a first output voltage at said first output node is a function of said first current and a second output voltage at said second output node is a function of said second current.

3. The memory device of claim 2, wherein said third circuit comprises a summing circuit coupled to an output of a first amplifier and an output of a second amplifier, and a gain of said first amplifier is controlled by said first output voltage and a gain of said second amplifier is controlled by said second output voltage.

4. The memory device of claim 3, wherein said first amplifier is a first transistor and said second amplifier is a second transistor.

5. The memory device of claim 1, wherein said first current mirror comprises a pair of first control devices and said second current mirror comprises a pair of second control devices.

6. The memory device of claim 5, said first pair of control devices is a pair of field effect transistors and said second pair of control devices is a pair of bipolar transistors.

7. A method for supplying power to a memory, comprising:
   producing a first control voltage in a first circuit including a first current mirror;
   producing a second control voltage in a second circuit including a second current mirror;
   amplifying an input current, at a gain controlled by said first control voltage, to produce a first output current;
   amplifying the input current, at a gain controlled by said second control voltage, to produce a second output current; and
   summing said first output current and said second output current to produce a third output current;
   wherein said third output current is approximately invariant over a range of temperatures and said first and second control voltages are approximately inverse functions over said range of temperatures.

8. The method of claim 7, wherein said first control voltage is produced by dividing a first voltage associated with a first current flowing through a first load coupled to said first current mirror, and said second control voltage is produced by dividing a second voltage associated with a second current flowing through a second load coupled to said second current mirror.

9. The method of claim 8, further comprising:
   controlling said first current via a pair of field effect transistors; and
   controlling said second current via a pair of bipolar transistors.

10. A power circuit, comprising:
    a first circuit comprising a first input node, a first output node, and a first current mirror;
    a second circuit comprising a second input node, a second output node, and a second current mirror;
    a third circuit, coupled to said first output node and said second output node, for producing from an input current, an output current, said output current being approximately invariant over a range of temperature;
    wherein said first current mirror flows a first current as a first function of temperature and said second current mirror flows a second current as a second function of temperature, and said first and second functions are approximately inverse functions of temperature.

11. The power circuit of claim 10, wherein a first output voltage at said first output node is a function of said first current and a second output voltage at said second output node is a function of said second current.

12. The power circuit of claim 11, wherein said third circuit comprises a summing circuit coupled to an output of a first amplifier and an output of a second amplifier, and a gain of said first amplifier is controlled by said first output voltage and a gain of said second amplifier is controlled by said second output voltage.

13. The power circuit of claim 12, wherein said first amplifier is a first transistor and said second amplifier is a second transistor.

14. The power circuit of claim 10, wherein said first current mirror comprises a pair of first control devices and said second current mirror comprises a pair of second control devices.

15. The power circuit of claim 14, said first pair of control devices is a pair of field effect transistors and said second pair of control devices is a pair of bipolar transistors.

16. A memory device, comprising:
    a memory subsystem; and
    a power subsystem, coupled to said memory subsystem and supplying an output current to said memory subsystem, said power subsystem further comprising:
       a first current mirror, for supplying at first current to a first load circuit, said first load circuit comprising a first field effect transistor and coupled in series with said first current mirror;
       a second current mirror, for supplying a second current to a second load circuit, said second load circuit comprising a first bipolar transistor and coupled in series with said second current mirror;
       a summing circuit, for producing said output current as a sum of a first sub-current and a second sub-current;
    wherein
       a level of said first sub-current is related to a voltage level of a first control node coupled between said first current mirror and said first load circuit, and
       a level of said second sub-current is related to a voltage level of a second control node coupled between said second current mirror and said second load circuit.

17. The memory device of claim 16, wherein said first load circuit further comprises a second field effect transistor, said first and second field effect transistors being coupled, in parallel, to said first current mirror respectively via a first source/drain of said first field effect transistor and a first source/drain of said second field effect transistor.

18. The memory device of claim 17, wherein a second source/drain of said first field effect transistor is coupled to a resistor.

19. The memory device of claim 17, wherein a gate of said first field effect transistor is coupled to said first current mirror and a gate of said second field effect transistor is coupled to said first current mirror.

20. The memory device of claim 16, wherein said second load circuit further comprises a second bipolar transistor, said first and second bipolar transistors being coupled, in parallel, to said second current mirror respectively via a collector of said first bipolar transistor and a collector of said second bipolar transistor.

21. The memory device of claim 20, wherein an emitter of said first bipolar transistor is coupled to a resistor.

22. The memory device of claim 20, wherein a base of said first bipolar transistor is coupled to said second current mirror and a base of said second bipolar transistor is coupled to a base of said second current mirror.

23. A method for supplying a power signal to a memory circuit in a memory device, said method comprising the steps of:
    providing, from a first current mirror, a first current to a first load circuit;
    providing a second current to a second load circuit; and
    summing a first sub-current and a second sub-current to produce said power signal;
    wherein
       a level of said first sub-current is related to a first voltage taken between said first current mirror and said first load circuit, and
       a level of said second sub-current is related to a second voltage taken between said second current mirror and said second load circuit.

24. The method of claint 23, wherein said first voltage is supplied as a control voltage to a first amplifier of a first input current and said second voltage is supplied as a control voltage to a second amplifier of said second input current.

25. The method of claim 24, wherein said first input current is supplied from a same source as said second input current.

* * * * *